United States Patent [19]

Sawamura

[11] Patent Number: 4,531,838

[45] Date of Patent: Jul. 30, 1985

[54] METHOD AND DEVICE FOR CONTROLLING THE FILM THICKNESS OF EVAPORATED FILM

[75] Inventor: Mitsuharu Sawamura, Yokohama, Japan

[73] Assignee: Canon Kabushiki Kaisha, Tokyo, Japan

[21] Appl. No.: 359,481

[22] Filed: Mar. 18, 1982

[30] Foreign Application Priority Data

Mar. 26, 1981 [JP] Japan .................................. 56-44457

[51] Int. Cl.³ ............................................. G01B 11/00
[52] U.S. Cl. ..................................... 356/382; 356/357
[58] Field of Search ...................... 356/381, 382, 357

[56] References Cited

U.S. PATENT DOCUMENTS 3,645,623 2/1972 Patten .................................. 356/381
3,737,237 6/1973 Zurasky ............................... 356/382
3,869,211 3/1975 Watanabe et al. .................. 356/381

OTHER PUBLICATIONS

Puryayev et al., "An Interferometer for Monitoring Layer Thickness During Vacuum Deposition," *Soviet Journal of Optical Technology*, vol. 40, No. 3, (Mar. 1973), pp. 162-164.

*Primary Examiner*—R. A. Rosenberger
*Attorney, Agent, or Firm*—Fitzpatrick, Cella, Harper & Scinto

[57] ABSTRACT

In film thickness control, different film thicknesses are evaporated on a first monitor and a second monitor provided in an evaporation tank, light beams of the same wavelength are projected onto the first monitor and the second monitor, the reflected lights from the first monitor and the second monitor are received and the reflection factors of the light beams from the monitors are detected.

5 Claims, 5 Drawing Figures

METHOD AND DEVICE FOR CONTROLLING THE FILM THICKNESS OF EVAPORATED FILM

BACKGROUND OF THE INVENTION

1. Field of the Invention

This invention relates to a method of controlling the film thickness of vacuum-evaporated film and a device therefor.

2. Description of the Prior Art

The monochromatic film thickness control method and the two-wavelength film thickness control method are popular as the conventional optical film thickness control methods. The monochromatic film thickness control method is a method wherein monochromatic light is used as the measuring light and the variation in reflection factor corresponding to the film thickness from a monitor during evaporation is used to control the film thickness. The two-wavelength film thickness control method is a method wherein two color lights are used as the measuring light and the variation in the difference in reflection factor between the two wavelengths corresponding to the film thickness from a monitor during evaporation is used to control the film thickness.

In the monochromatic film thickness control method, film thickness is usually controlled at the peak or valley of the output variation in reflection factor corresponding to an integer times $\frac{1}{4}$ of the wavelength of the monochromatic light. However, the vicinity of this extremal value is insensible in the variation in reflection factor for the variation in film thickness, and the controlled film thickness often contains an error from a predetermined film thickness. Thus, this method suffers from the disadvantage that it is poor in reproducibility.

On the other hand, the conventionally practised two-wavelength film thickness control method is a method of controlling film thickness by observing in two different wavelengths monitors to which the same film thickness adheres. That is, where a film thickness an integer times $\frac{1}{4}$ of the design wavelength $\lambda_0$ is to be controlled, if two wavelengths $\lambda_1$ and $\lambda_2$, one shorter than $\lambda_0$ and one longer than $\lambda_0$ and which satisfy the relation that $2/\lambda_0 = 1/\lambda_1 + 1/\lambda_2$, (and a wavelength longer than $\lambda_0$ which satisfies such relation) are selected, the reflection factors at the wavelengths $\lambda_1$ and $\lambda_2$ become equal to each other when the film thickness is an integer times $\lambda_0/4$ and by utilizing this, the zero point of the output of the difference in reflection factor between the wavelengths is observed to control the film thickness of the evaporated film. The vicinity of this zero point is sensitive in the output variation of the difference in reflection factor for the variation in film thickness and accordingly, it is good in reproducibility. However, this zero point corresponds to a film thickness of $\frac{1}{4}$ of the controlling wavelength $\lambda_0$ where the controlled film includes no dispersion of refractive index, and the film thickness controlled at the zero point becomes greater than the target value where the controlled film is a high refractive index film having a high dispersion. That is, where alternate multi-layer films of $\lambda_0/4$ integer film construction comprising a high refractive index film and a low refractive index film are to be formed, there is the disadvantage that the film thickness ratio between the high refractive index film and low refractive index film does not become an integer.

SUMMARY OF THE INVENTION

It is an object of the present invention to provide a film thickness control method which is excellent in reproducibility of evaporated film thickness and a device therefor.

It is a further object of the present invention to provide a film thickness control method which enables a desired film thickness to be obtained even for a film of a substance having a dispersion of refractive index, and a device therefor.

In the conventional two-wavelength film thickness control method, monitor beams of two different wavelengths are applied to monitors of the same film thickness to thereby obtain a phase difference between the monitor beams, whereas in the film thickness control method according to the present invention, even if the monitor beams are of a single wavelength, the thicknesses of evaporated films monitored by the respective beams are made to differ from each other to thereby cause a phase difference to be produced between the monitor beams, thereby obtaining entirely the same effect as that of the conventional two-wavelength film thickness control method.

In the film thickness control method according to the present invention, a first monitor and a second monitor on which evaporations are effected at different predetermined evaporation speeds are provided in an evaporation tank and these monitors are observed by light beams of the same wavelength of thereby achieve the above objects. The evaporation speed refers to the thickness of the evaporated film deposited on a monitor per unit time, and a great evaporation speed means that the film thickness of the evaporated film deposited per unit time is great.

The film thickness control device according to the present invention is provided with means for making the thicknesses of films evaporated per unit time on a first monitor and a second monitor provided in an evaporation tank differ from each other, light source means for supplying light beams of the same wavelength to the first and second monitors, and detecting means for detecting the light beams reflected by the first and second monitors and discriminating from the detection signal whether the evaporated films are in a predetermined condition.

The invention will become more fully apparent from the following detailed description thereof taken in conjunction with the accompanying drawings.

DESCRIPTION OF THE PREFERRED EMBODIMENT

Figure 1:
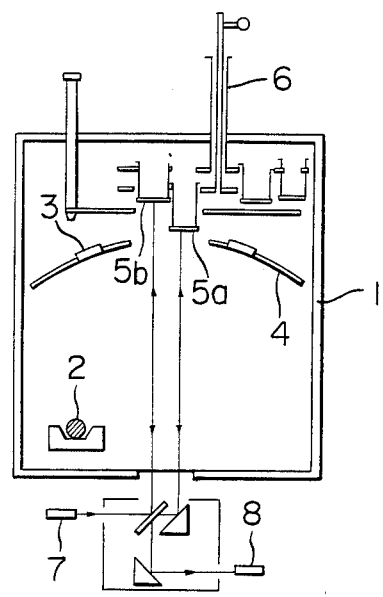
FIG. 1 shows an embodiment of an evaporation apparatus using the film thickness control method according to the present invention.

FIG. 1 shows an embodiment of an evaporation apparatus provided with the film thickness control device according to the present invention. The evaporation apparatus shown in FIG. 1 has, in a vacuum evaporation tank 1, an evaporation source 2 and an umbrella 4 for matting a substrate 3 receiving evaporation, two monitors 5a and 5b of different heights disposed near the center of rotation of the umbrella 4 for controlling the evaporated film thickness, a monitor mechanism 6 which enables interchange of the monitors by vertically moving and rotating the monitors 5a and 5b, and, outside the evaporation tank, a film thickness monitoring device comprising a monochromatic light source 7 and a detector 8 for measuring the quantity of reflected light from each of the monitors.

In FIG. 1, let $\lambda_0$ be the wavelength of the monitor beam and $nd_0$ be the target film thickness of the evaporated film evaporated on a phantom monitor. This phantom monitor is not actually provided but, as will hereinafter be described, the term "phantom monitor" is used in the sense as if a monitor existed at that position. In the present application, by controlling the thickness of the film evaporated on this phantom monitor as a target value, the evaporated film on a sample may assume a desired value. That is, the height $h_1$ of the monitor 5a and the height $h_2$ of the monitor 5b are set such that when the film thickness on the phantom monitor has become $nd_0$, the film thickness $nd_1$ on the monitor 5a becomes $$nd_1 = nd_0 \times \lambda_0/\lambda_1 \quad (1)$$

and the film thickness $nd_2$ on the monitor 5b becomes $$nd_2 = nd_0 \times \lambda_0/\lambda_2 \quad (2)$$

It is to be understood that such a height of the phantom monitor that the film thickness is $nd_0$ at this time is $h_0$ ($h_1 < h_0 < h_2$). $\lambda_1$ and $\lambda_2$ in equations (1) and (2) are the same wavelengths as the wavelengths used in the two-wavelength film thickness control method.

As this time, the phase variation $\delta_1$ of the film on the monitor 5a, the phase variation $\delta_2$ of the film on the monitor 5b and the phase variation $\delta_0$ of the film on the phantom monitor are expressed as follows:

$$\delta_1 = \frac{4\pi}{\lambda_0} nd_1 \quad (3)$$

$$\delta_2 = \frac{4\pi}{\lambda_0} nd_2$$

$$\delta_0 = \frac{4\pi}{\lambda_0} nd_0$$

Also, if the phase advance or delay of the monitors 5a and 5b relative to the phantom monitor is $\alpha$, $\delta_1$ and $\delta_2$ are expressed as follows:

$$\delta_1 = \delta_0 + \alpha$$

$$\delta_2 = \delta_0 - \alpha \quad (4)$$

From equations (3) and (4), the following equation is established.

$$2nd_0 = nd_1 + nd_2 \quad (5)$$

that is, by setting the positions ($h_1$, $h_2$) of the monitors 5a, 5b to such positions that the film thickness $nd_1$ on the monitor 5a and the film thickness $nd_2$ on the monitor 5b satisfy equation (5) when a film has been evaporated at a thickness of $nd_0$ on the phantom monitor supposed to be placed at a height $h_0$, the target film thickness $nd_0$ can be obtained on the phantom monitor of height $h_0$ when the reflection factors of the light beams reflected by the monitors have become equal to each other. Accordingly, in the method according to the present invention, the reflection factors of the light beams reflected by the monitors 5a and 5b are measured and where the reflection factors become equal to each other, that is, where the difference between the reflection factors of the two monitors becomes zero, the film thickness can be controlled.

By knowing in advance the film thickness ratio of the evaporated film thickness on the substrate 3 actually subjected to evaporation to the evaporated film thickness on the phantom monitor, the film thickness on the substrate 3 can be accurately obtained in the form of the film thickness on the phantom monitor multiplied by a proportional constant. Accordingly, if the correspondence between the film thicknesses on the substrate 3 and the phantom monitor is changed, for example, if the heights of the monitors 5a and 5b are varied with the interval between these monitors remaining unchanged, the target film thickness on the substrate 3 can be freely selected. If the film thickness monitoring positions $h_1$ and $h_2$ according to the method of the present invention are moved in the range of ±100 mm from the face position of the umbrella 4, the target film thickness on the substrate can be freely obtained in the range of 100–150 mm (the wavelength range of 400–600 nm) at $\lambda_0 = 480$ nm, with a height of 700 mm of the face position of the umbrella 4 and a distance of 100 mm from the center of rotation of the umbrella of the evaporation source.

Figure 2:
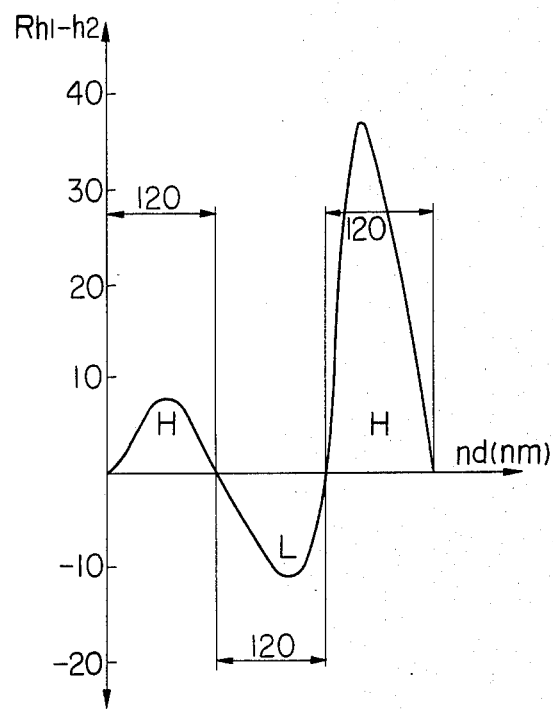
FIG. 2 shows the output waveform from control detecting means in a case where the film thickness control method according to the present invention is used.
Figure 3:
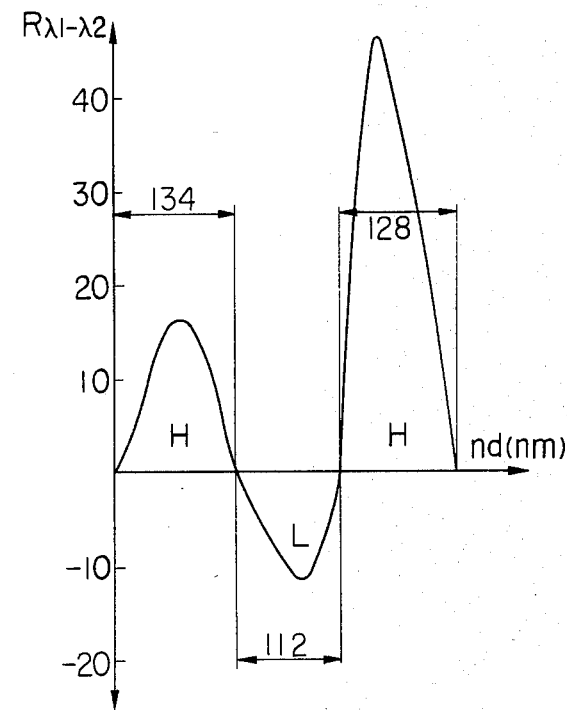
FIG. 3 shows the output waveform from control detecting means in a case where the conventional two-wavelength film thickness control method is used.

FIG. 2 shows the manner of variation in the detection output from detecting means by the film thickness control method according to the present invention, and FIG. 3 shows the variation in the detection output by the conventional two-wavelength film thickness control method. The detecting means herein described is means for detecting the difference in reflection factor between the two monitors 5a and 5b, and such means may be the detecting means used in the conventional two-wavelength film thickness control method and therefore need not be described herein. In FIGS. 2 and 3, the vertical axis represents the difference in reflection factor and the horizontal axis represents the film thickness evaporated on the substrate. The two wavelengths shown in FIG. 3 are $\lambda_1 = 410$ nm and $\lambda_2 = 580$ nm which correspond to the wavelengths $\lambda_1 = 410$ nm and $\lambda_2 = 580$ nm providing the film thicknesses of equations (1) and (2) in the present invention. H is a zinc sulfide film whose refractive index n follows the dispersion equation $n = 2.12 + 594/(\lambda - 274)$, and L is a crystal film whose refractive index is $n = 1.36$. The film reflection factors $Rh_1$ and $Rh_2$ of the monitors 5a and 5b are those at a standard wavelength 480 nm and are identical to each other and therefore, they are entirely free from the influence of dispersion and thus, the target film thickness 120 nm can be obtained as shown in FIG. 2. The conditions are varied in no way by increasing the number of layers and therefore, alternate layers of film thickness $\lambda_0/4$ having a film thickness ratio of H to L which is 1:1 can be obtained.

On the other hand, as shown in FIG. 3 in the two-wavelength control method which is the conventional control method, there is an influence of dispersion and therefore, the film of high refractive index is evaporated more thickly than a predetermined film thickness and the film of low refractive index is evaporated more thinly than the predetermined film thickness.

Figure 4:
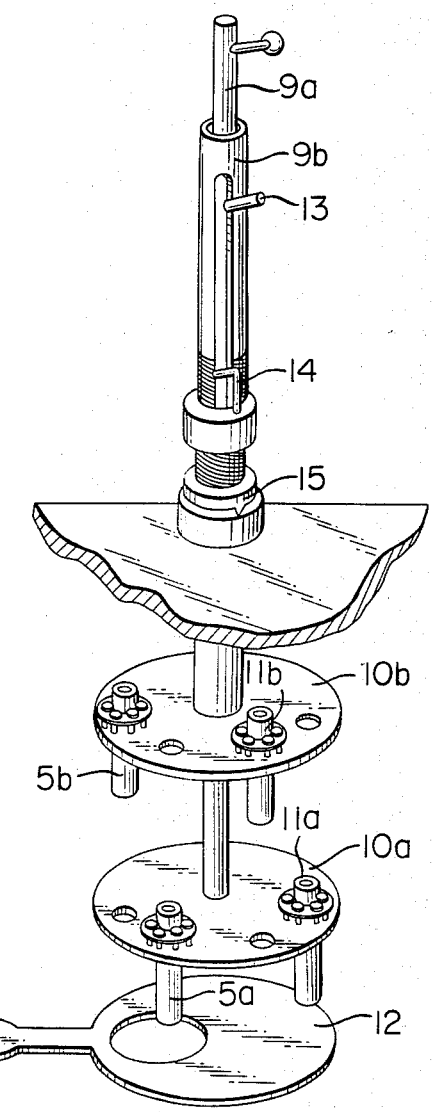
FIG. 4 shows the detailed construction of the monitor mechanism in the apparatus shown in FIG. 1.

FIG. 4 shows the details of the monitor mechanism 6 of the film thickness control device shown in FIG. 1. The evaporation speed of the evaporated films evaporated on the monitors 5a and 5b is adjusted by this monitor mechanism. In FIG. 4, the monitors 5a and 5b are set on optical axis adjusting monitor holders 11a and 11b, respectively, on discs 10a and 10b. The optical axis adjusting monitor holders are for adjusting the angle so that the reflected light from the monitors properly enters the detector 8, by suitably fastening a screw. The discs 10a and 10b are connected to shafts 9a and 9b, respectively, and by raising the shaft 9a, the shaft 9b is also raised at the same time by the action of a stopper 13 and, when the shaft 9a is rotated, the shaft 9b also rotates likewise and the shaft 9a lowers with the shaft 9b until a stopper 15 strikes. Further, by adjusting the position whereat a stopper 14 strikes, the difference in height between the monitors 5a and 5b can be adjusted. Thus, the monitor mechanism 6 enables vertical movement and rotation of the monitors 5a and 5b, adjustment of the difference in height between the monitors 5a and 5b, and interchange of the monitors.

Figure 5:
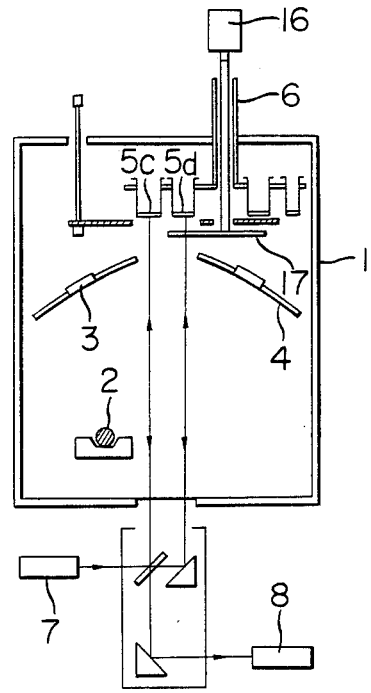
FIG. 5 shows another embodiment of the evaporation apparatus using the film thickness control method according to the present invention.

In the embodiment shown in FIG. 1, the heights of the monitors 5a and 5b have been varied as the means for making the evaporation speeds of the evaporated films evaporated on the respective monitors differ from each other, but as another means, monitors of the same height as shown in FIG. 5 may be used to make the evaporation speeds on the monitors differ from each other. As shown in FIG. 5, by using monitors 5c and 5d of the same height and rotating a chopper 17 connected to an external driving motor 16, only the film thickness on the monitor 5a can be reduced.

Also, by combining the film thickness control devices shown in FIGS. 1 and 5 and reducing the film thickness on one of two monitors of different heights by the use of a chopper, it is easy to control the film thickness over the entire wavelength range by the use only of a monochromatic light source.

In the present invention, monitors having different evaporated film thicknesses are irradiated with a single wavelength and the difference between the reflection factors from the monitors is used to control the film thickness. Therefore, an interference filter for obtaining two different wavelengths as in the prior art becomes unnecessary, the optical system is simplified, and adjustment of the optical axis becomes easy. Further, if two kinds of monochromatic light source such as an argon laser of wavelength 488 nm and a helium neon laser of wavelength 633 nm are prepared as the light source unit, it will be possible to effect film thickness control in the wavelength range of 400 nm–750 nm.

As described above, in the film thickness control method according to the present invention, in spite of using a monochromatic light, there is reproducibility of controlled film thickness similar to that of two-wavelength film thickness control method and further, film thickness control is carried out in the wavelength of monochromatic light and this leads to an excellent effect that the target film thickness can be obtained without the influence of the dispersion of the refractive index of the controlled film.

I claim:

1. A device for controlling the film thickness of evaporated film, comprising:
    a first monitor having a surface to which an evaporated film adheres;
    a second monitor having a surface to which an evaporated film adheres;
    means for evaporating films onto said surfaces of both of said monitors at once, said first and second monitors being disposed such that the evaporated film adheres to said surface of said first monitor at a different rate from that at which the evaporated film adheres to said surface of said second monitor;
    means for applying light beams of the same wavelength to said first monitor and said second monitor; and
    means for detecting the quantity of light applied by said applying means and reflected by each of said first and second monitors.

2. A device for controlling the film thickness of evaporated film comprising:
    a first monitor and a second monitor provided in a vacuum evaporation tank;
    means for making the thickness of a film evaporated per unit time onto said first monitor and the thickness of a film evaporated per unit time onto said second monitor differ from each other, with both exceeding zero; and
    a film thickness monitoring device provided outside said vacuum evaporation tank, said monitoring device having means for projecting a light beam of single wavelength onto said first and second monitors, means for receiving the light beams reflected by said first and second monitors, and means for detecting the difference in reflection factor between the reflected light from said first and from said second monitors by the signal from said light receiving means.

3. A device for controlling the film thickness of evaporated film, comprising:
    a first monitor and a second monitor provided in a vacuum evaporation tank;
    means for making the thickness of films evaporated per unit time onto said first and second monitors differ from each other; and
    a film thickness monitoring device provided outside said vacuum evaporation tank, said monitoring device having means for projecting a light beam of single wavelength onto said first and second monitors, means for receiving the light beams reflected by said first and second monitors, and means for detecting the difference in reflection factor between the respective reflected light from said first and from said second monitors by the signal from said light receiving means;
    wherein said means for making the film thicknesses on said first monitor and said second monitor differ from each other is a mechanism for varying the distance from an evaporation source to said first monitor and the distance from said evaporation source to said second monitor.

4. A device for controlling the film thickness of evapoarated film, comprising:
    a first monitor and a second monitor provided in a vacuum evaporation tank;

means for making the thickness of films evaporated per unit time onto said first and second monitors differ from each other; and a film thickness monitoring device provided outside said vacuum evaporation tank, said monitoring device having means for projecting a light beam of single wavelength onto said first and second monitors, means for receiving the light beams reflected by said first and second monitors, and means for detecting the difference in reflection factor between the respective reflected light from said first and from said second monitors by the signal from said light receiving means;

wherein said means for making the film thicknesses on said first monitor and said second monitor differ from each other is a chopper disposed between one of said monitors and an evaporation source which causes an evaporation substance to be evaporated for controlling the film thicknesses adhering to said monitors.

5. A method of controlling the film thickness of evaporated film, comprising the steps of:

simultaneously evaporating different film thicknesses onto a first monitor and a second monitor provided in an evaporation tank;

projecting light beams of the same wavelength second monitor; and receiving the reflected lights from the first monitor and the second monitor and detecting the reflection factors of the light beams from the monitors.

* * * * *

UNITED STATES PATENT AND TRADEMARK OFFICE
CERTIFICATE OF CORRECTION

PATENT NO. : 4,531,838
DATED : July 30, 1985
INVENTOR(S) : MITSUHARU SAWAMURA

It is certified that error appears in the above-identified patent and that said Letters Patent is hereby corrected as shown below:

Column 2, line 31, change "of thereby" to --to--.

Column 8, line 11, after "wavelength" insert --onto the films on the first monitor and the--.

Signed and Sealed this

Twenty-fifth Day of February 1986

[SEAL]

Attest:

DONALD J. QUIGG

Attesting Officer

Commissioner of Patents and Trademarks